United States Patent
Won et al.

(10) Patent No.: US 10,490,236 B2
(45) Date of Patent: Nov. 26, 2019

(54) SEMICONDUCTOR MEMORY DEVICE WITH SENSE AMPLIFIER THAT IS SELECTIVELY DISABLED

(71) Applicant: SK hynix Inc., Gyeonggi-do (KR)

(72) Inventors: Hyung Sik Won, Chungcheongbuk-do (KR); Hong Jung Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/015,914

(22) Filed: Jun. 22, 2018

(65) Prior Publication Data

US 2019/0164580 A1 May 30, 2019

(30) Foreign Application Priority Data

Nov. 30, 2017 (KR) .................. 10-2017-0162997

(51) Int. Cl.
| | |
|---|---|
| G11C 7/08 | (2006.01) |
| G11C 5/14 | (2006.01) |
| G11C 7/12 | (2006.01) |
| G11C 7/10 | (2006.01) |
| G11C 7/22 | (2006.01) |

(52) U.S. Cl.
CPC ............. *G11C 7/08* (2013.01); *G11C 5/147* (2013.01); *G11C 7/1096* (2013.01); *G11C 7/12* (2013.01); *G11C 7/222* (2013.01); *G11C 2207/229* (2013.01)

(58) Field of Classification Search
None
See application file for complete search history.

(56) References Cited

FOREIGN PATENT DOCUMENTS

| KR | 1020040042343 | * | 5/2004 |
| KR | 1020050117129 | * | 6/2004 |
| KR | 1020050117129 | | 12/2005 |

* cited by examiner

*Primary Examiner* — James G Norman
(74) *Attorney, Agent, or Firm* — IP & T Group LLP

(57) ABSTRACT

A semiconductor memory device includes a sense amplifier control circuit configured to generate a first sense amplifier driving voltage application signal, a second sense amplifier driving voltage application signal and a third sense amplifier driving voltage application signal in response to an active signal, a precharge signal and a write pulse; and a sense amplifier driving voltage providing circuit configured to provide driving voltages to a sense amplifier through first and second driving voltage application lines during enable periods of the first to third sense amplifier driving voltage application signals.

14 Claims, 3 Drawing Sheets

SEMICONDUCTOR MEMORY DEVICE WITH SENSE AMPLIFIER THAT IS SELECTIVELY DISABLED

CROSS-REFERENCES TO RELATED APPLICATION

The present application claims priority under 35 U.S.C. § 119(a) to Korean application number 10-2017-0162997, filed on Nov. 30, 2017, in the Korean Intellectual Property Office, which is incorporated herein by reference in its entirety.

BACKGROUND

1. Technical Field

Various embodiments generally relate to a semiconductor integrated circuit. Particularly, the embodiments relate to a semiconductor memory device.

2. Related Art

Semiconductor memory devices receive and store data and output stored data.

As semiconductor memory devices aims to achieve low power consumption and high speed operation, efforts have been made to reduce power consumption when receiving and storing data and improve speed of storing data.

SUMMARY

Various embodiments are directed to a semiconductor memory device for reducing power consumed in storage of data while improving a data storage speed.

In an embodiment, a semiconductor memory device may include: a sense amplifier control circuit configured to generate a first sense amplifier driving voltage application signal, a second sense amplifier driving voltage application signal and a third sense amplifier driving voltage application signal in response to an active signal, a precharge signal and a write pulse; and a sense amplifier driving voltage providing circuit configured to provide driving voltages to a sense amplifier during enable periods of the first to third sense amplifier driving voltage application signals.

In an embodiment, a semiconductor memory device may include: a sense amplifier control circuit configured to enable a sense amplifier driving voltage application signal in response to an active signal, and disable the sense amplifier driving voltage application signal in response to a precharge signal and a write pulse; and a sense is amplifier driving voltage providing circuit configured to provide a voltage to a sense amplifier during an enable period of the sense amplifier driving voltage application signal.

In an embodiment, a semiconductor memory device comprising: a sense amplifier; and a driving voltage generation circuit configured to generate a driving voltage for driving the sense amplifier, which disables the sense amplifier in response to last write command among the series of write commands.

According to the embodiments, the semiconductor memory device provides advantages in that a data storage speed is improved and power consumed in storage of data is reduced.

DETAILED DESCRIPTION

Figure 1:
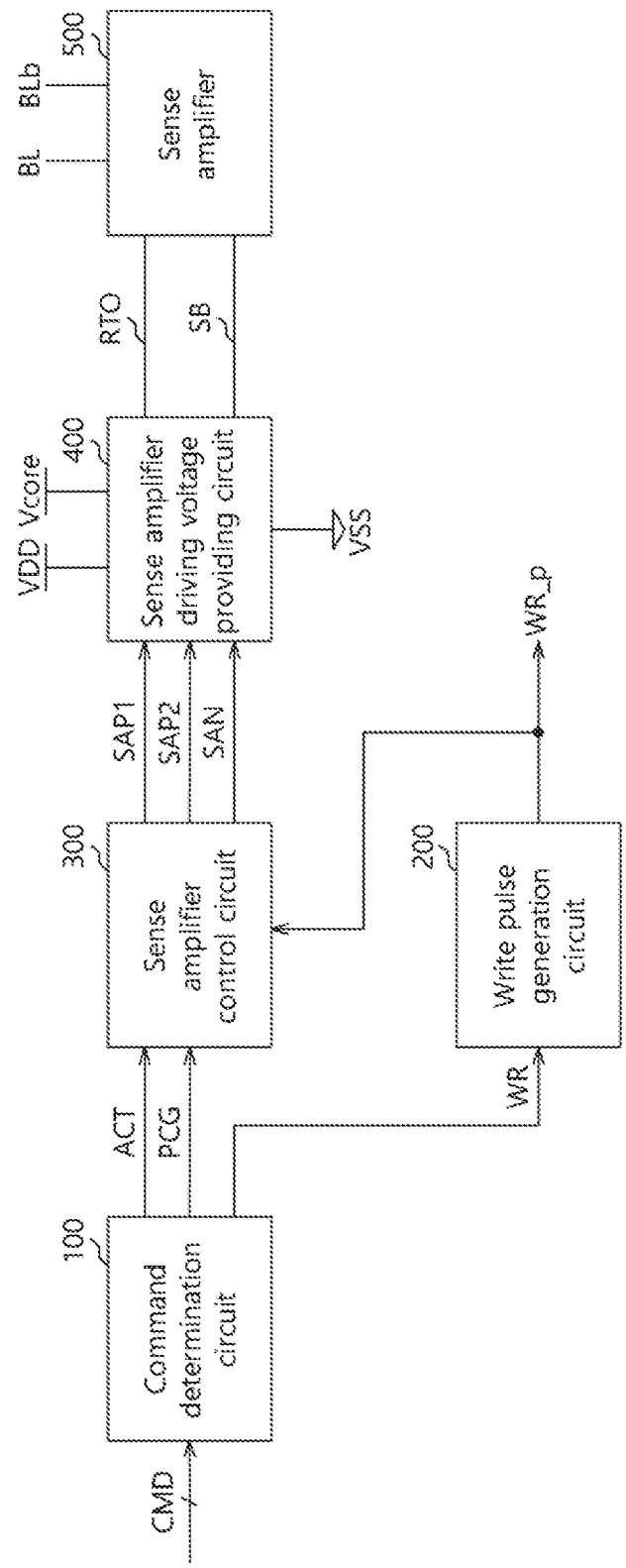
FIG. 1 is a diagram illustrating a semiconductor memory device in accordance with an embodiment.

Various embodiments of the present invention are described below in more detail with reference to the accompanying drawings. We note, however, that the present invention may be embodied in different forms and variations, and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention.

As used herein, singular forms may include the plural forms as well and vice versa, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

It is noted that reference to "an embodiment" does not necessarily mean only one embodiment, and different references to "an embodiment" are not necessarily to the same embodiment(s).

Hereinafter, a semiconductor memory device will be described below with reference to the accompanying drawings through various examples of embodiments.

As shown in FIG. 1, a semiconductor memory device in accordance with an embodiment may include a command determination circuit 100, a write pulse generation circuit 200, a sense amplifier control circuit 300, a sense amplifier driving voltage providing circuit 400, and a sense amplifier 500.

The command determination circuit 100 may generate an active signal ACT, a precharge signal PCG, and a write signal WR in response to a command CMD. The command determination circuit 100 may generate a plurality of signals for controlling the operation of the is semiconductor memory device, in response to the command CMD received externally. By way of example and not limitation, the command determination circuit 100 may generate a read signal and a refresh signal (not shown in FIG. 1) in addition to the active signal ACT, the precharge signal PCG, and the write signal WR. In the present embodiment, it is illustrated as an example that the command determination circuit 100 generates the active signal ACT, the precharge signal PCG, and the write signal WR in response to the command CMD.

The command determination circuit 100 may include a decoder which decodes the command CMD and generates the active signal ACT, the precharge signal PCG, and the write signal WR based on the command CMD.

The write pulse generation circuit 200 may generate a write pulse WR_p in response to the write signal WR. For example, the write pulse generation circuit 200 may generate the write pulse WR_p when a predetermined time elapses after the write signal WR is generated. The predetermined time is determined depending on a predetermined write latency.

The sense amplifier control circuit 300 may generate first to third sense amplifier driving voltage application signals SAP1, SAP2, and SAN in response to the active signal ACT, the precharge signal PCG and the write pulse WR_p. For example, the sense amplifier control circuit 300 may enable the first and third sense amplifier driving voltage application signals SAP1 and SAN in response to the active is signal ACT. The sense amplifier control circuit 300 may enable the second sense amplifier driving voltage application signal SAP2 when the first sense amplifier driving voltage application signal SAP1 is disabled. The sense amplifier control circuit 300 may disable the second and third sense amplifier driving voltage application signals SAP2 and SAN for a preset time in response to the precharge signal PCG and the write pulse WR_p, and may enable them after the preset time. The sense amplifier control circuit 300 may disable the second and third sense amplifier driving voltage application signals SAP2 and SAN which are enabled, in response to the precharge signal PCG.

The sense amplifier driving voltage providing circuit 400 may selectively apply driving voltages such as an external voltage VDD, a core voltage Vcore, and a ground voltage VSS, to first and second driving voltage application lines RTO and SB in response to the first to third sense amplifier driving voltage application signals SAP1, SAP2, and SAN. For example, the sense amplifier driving voltage providing circuit 400 may apply the external voltage VDD to the first driving voltage application line RTO in response to the first sense amplifier driving voltage application signal SAP1. The sense amplifier driving voltage providing circuit 400 may apply the core voltage Vcore to the first driving voltage application line RTO in response to the second sense amplifier driving voltage application signal SAP2. The sense amplifier driving voltage providing circuit 400 may apply the ground voltage VSS to the second driving voltage application line SB in response to the third sense amplifier driving voltage application signal is SAN.

The sense amplifier 500 is activated when it is applied with the driving voltages VDD, Vcore, and VSS through the first and second driving voltage application lines RTO and SB. The sense amplifier 500 may sense and amplify the voltage difference of a bit line BL and a bit line bar BLb.

Figure 2:
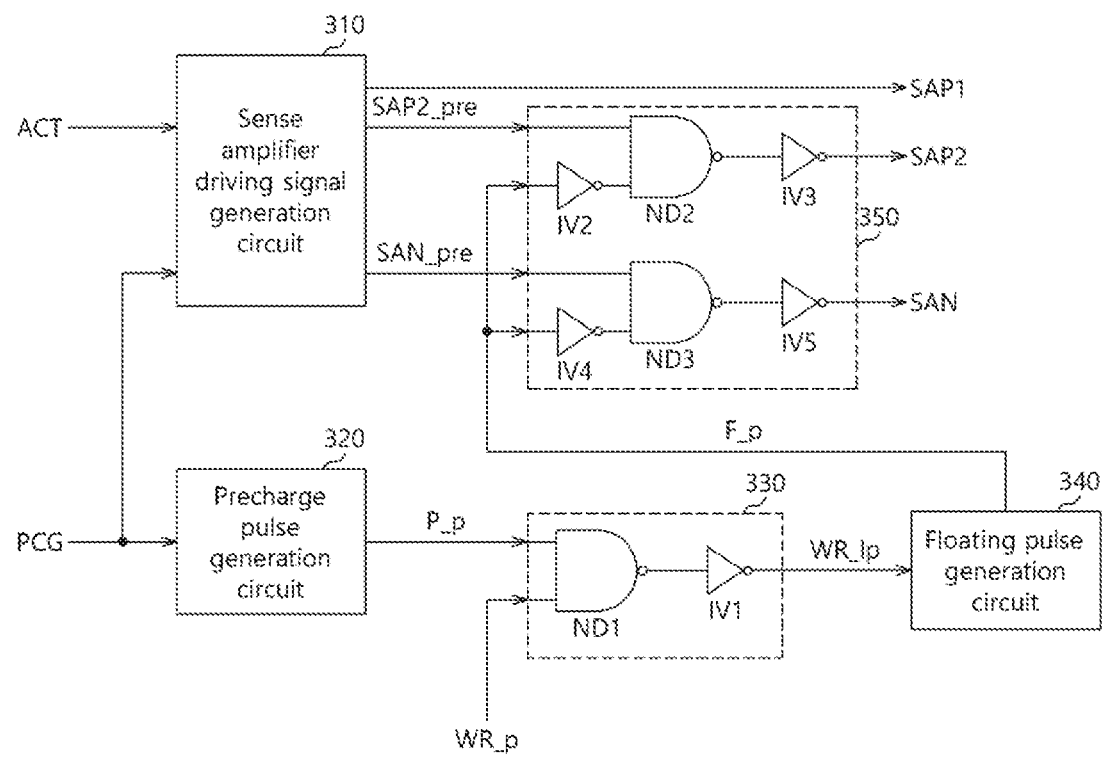
FIG. 2 is a diagram illustrating a sense amplifier control circuit in accordance with an embodiment.

FIG. 2 is a diagram illustrating a sense amplifier control circuit 300 in accordance with an embodiment.

Referring to FIG. 2, the sense amplifier control circuit 300 may include a sense amplifier driving signal generation circuit 310, a precharge pulse generation circuit 320, a last write pulse detection circuit 330, a floating pulse generation circuit 340, and a floating control circuit 350.

The sense amplifier driving signal generation circuit 310 may generate the first sense amplifier driving voltage application signal SAP1, a second pre-sense amplifier driving voltage application signal SAP2_pre and a third pre-sense amplifier driving voltage application signal SAN_pre in response to the active signal ACT and the precharge signal PCG. For example, the sense amplifier driving signal generation circuit 310 may enable the first sense amplifier driving voltage application signal SAP1 for a preselected time in response to the active signal ACT. The sense amplifier driving signal generation circuit 310 may enable the third pre-sense amplifier driving voltage application signal SAN_pre in response to the active signal ACT. The sense amplifier driving signal generation circuit 310 may enable the second pre-sense amplifier driving voltage application signal SAP2_pre when the first sense amplifier driving voltage application signal SAP1 is disabled. The sense amplifier driving signal generation circuit 310 may disable the second and third pre-sense amplifier driving voltage application signals SAP2_pre and SAN_pre in response to the precharge signal PCG.

The precharge pulse generation circuit 320 may generate a precharge pulse P_p in response to the precharge signal PCG. The precharge pulse generation circuit 320 may generate the precharge pulse P_p when a predetermined time elapses after the precharge signal PCG is received.

The last write pulse detection circuit 330 may generate a detection pulse WR_lp in response to the precharge pulse P_p and the write pulse WR_p. For example, the last write pulse detection circuit 330 may output the write pulse WR_p as the detection pulse WR_lp when the write pulse WR_p is received during the enable period of the precharge pulse P_p.

The last write pulse detection circuit 330 may include a first NAND gate ND1 and a first inverter IV1. The first NAND gate ND1 receives the precharge pulse P_p and the write pulse WR_p. The first inverter IV1 receives the output of the first NAND gate ND1, and outputs the detection pulse WR_lp.

The floating pulse generation circuit 340 may generate a floating pulse F_p in response to the detection pulse WR_lp. For example, the floating pulse generation circuit 340 may generate the floating pulse F_p when the detection pulse WR_lp is received.

The floating control circuit 350 may generate the second and third sense amplifier driving voltage application signals SAP2 and SAN in response to the second and third pre-sense amplifier driving voltage application signals SAP2_pre and SAN_pre and the floating pulse F_p. For example, the floating control circuit 350 may disable the second and third pre-sense amplifier driving voltage application signals SAP2_pre and SAN_pre which are enabled, during the enable period of the floating pulse F_p, and output the second and third sense amplifier driving voltage application signals SAP2 and SAN.

The floating control circuit 350 may include second and third NAND gates ND2 and ND3 and second to fifth inverters IV2, IV3, IV4, and IV5. The second inverter IV2 receives the floating pulse F_p. The second NAND gate ND2 receives the output signal of the second inverter IV2 and the second pre-sense amplifier driving voltage application signal SAP2_pre. The third inverter IV3 receives the output signal of the second NAND gate ND2, and outputs the second sense amplifier driving voltage application signal SAP2. The fourth inverter IV4 receives the floating pulse F_p. The third NAND gate ND3 receives the output signal of the fourth inverter IV4 and the third pre-sense amplifier driving voltage application signal SAN_pre. The fifth inverter IV5 receives the output signal of the third NAND gate ND3, and outputs the third sense amplifier driving voltage application signal SAN.

Figure 3:
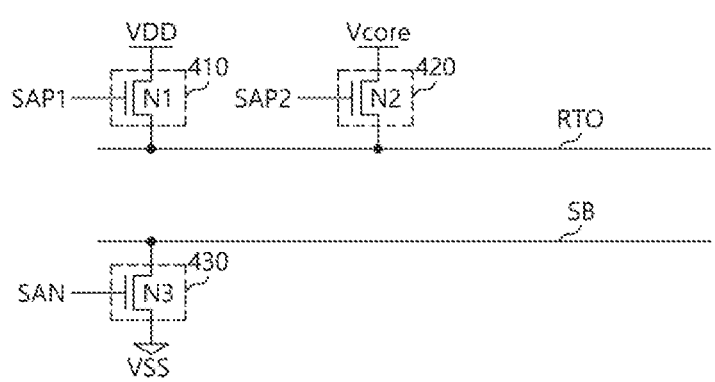
FIG. 3 is a diagram illustrating a sense amplifier driving voltage providing circuit in accordance with an embodiment.

FIG. 3 is a diagram illustrating a sense amplifier driving voltage providing circuit 400 in accordance with an embodiment.

As shown in FIG. 3, the sense amplifier driving voltage providing circuit 400 may include first to third voltage switch circuits 410, 420, and 430.

The first voltage switch circuit 410 may provide the external voltage VDD to the first driving voltage application line RTO in response to the first sense amplifier driving voltage application signal SAP1. For example, the first voltage switch circuit 410 may provide the external voltage VDD to the first driving voltage application line RTO during the enable period of the first sense amplifier driving voltage application signal SAP1.

The first voltage switch circuit 410 may include a first transistor N1. The first transistor N1 has a gate which receives the first sense amplifier driving voltage application signal SAP1, a drain which is applied with the external voltage VDD, and a source coupled to the first driving voltage application line RTO.

The second voltage switch circuit 420 may provide the core voltage Vcore to the first driving voltage application line RTO in response to the second sense amplifier driving voltage application signal SAP2. For example, the second voltage switch circuit 420 may provide the core voltage Vcore to the first driving voltage application line RTO during the enable period of the second sense amplifier driving voltage application signal SAP2.

The second voltage switch circuit 420 may include a second transistor N2. The second transistor N2 has a gate which receives the second sense amplifier driving voltage application signal SAP2, a drain is which is applied with the core voltage Vcore, and a source coupled to the first driving voltage application line RTO.

The third voltage switch circuit 430 may provide the ground voltage VSS to the second driving voltage application line SB in response to the third sense amplifier driving voltage application signal SAN. For example, the third voltage switch circuit 430 may provide the ground voltage VSS to the second driving voltage application line SB during the enable period of the third sense amplifier driving voltage application signal SAN.

The third voltage switch circuit 430 may include a third transistor N3. The third transistor N3 has a gate which receives the third sense amplifier driving voltage application signal SAN, a drain coupled to the second driving voltage application line SB, and a source which is applied with the ground voltage VSS.

The operation of the semiconductor memory device in accordance with the embodiment, configured as mentioned above, will be described below with reference to FIG. 4.

Figure 4:
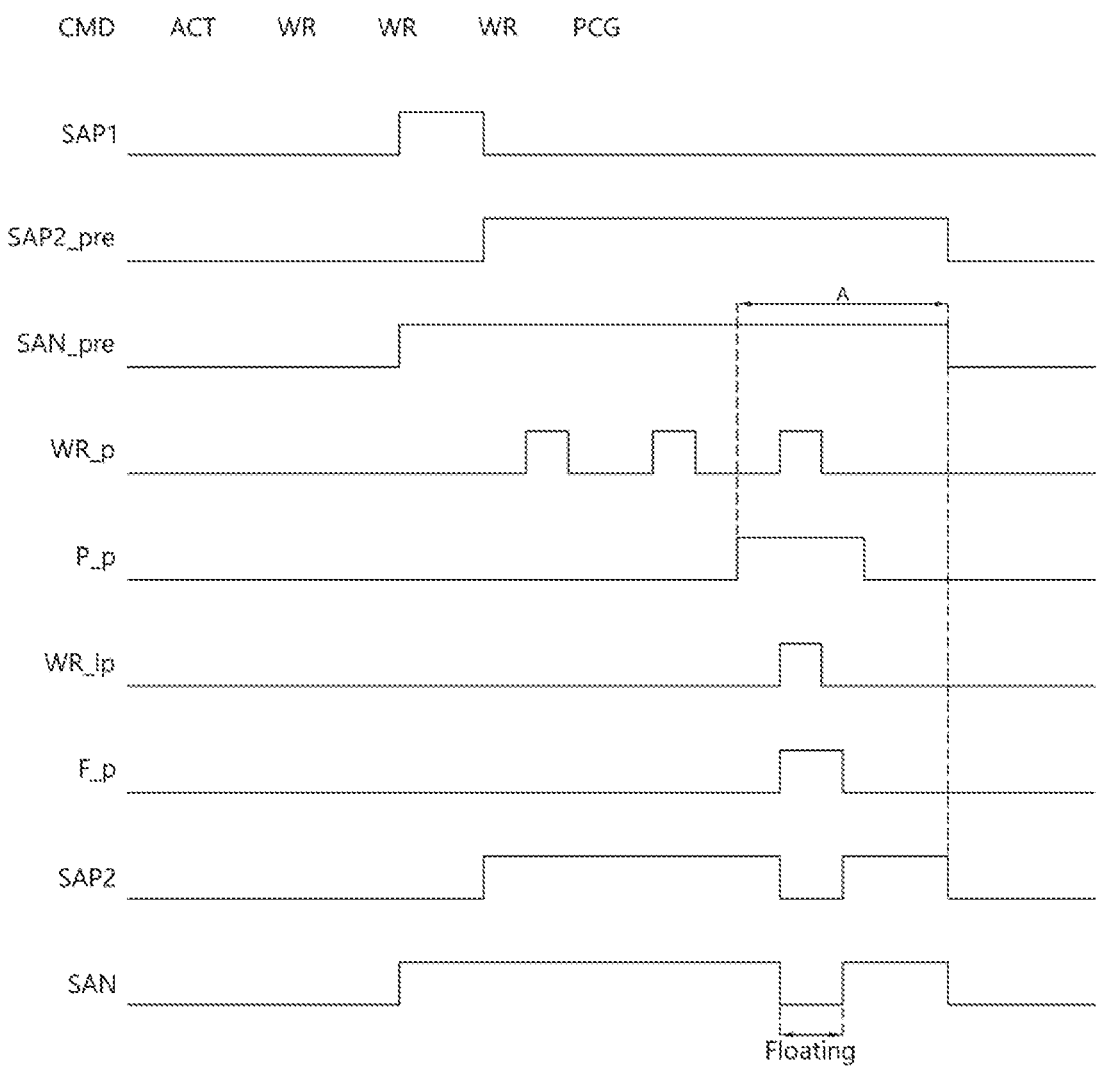
FIG. 4 is a timing diagram describing an operation of a semiconductor memory device in accordance with an embodiment.

FIG. 4 is a timing diagram describing an operation of a semiconductor memory device in accordance with an embodiment.

Referring to FIG. 4, the command determination circuit 100 of FIG. 1 receives the command CMD. It is assumed that, as shown in FIG. 4, the command determination circuit 100 sequentially receives an active command, three write commands, and a precharge command.

The command determination circuit 100 sequentially generates the active signal ACT, the three write signals WR, and the precharge signal PCG in response to the commands CMD inputted thereto.

The sense amplifier control circuit 300 generates the first to third sense amplifier driving voltage application signals SAP1, SAP2, and SAN in response to the active signal ACT, the three write signals WR, and the precharge signal PCG which are sequentially generated in the command determination circuit 100.

The operation of the sense amplifier control circuit 300 will be described below with additional reference to FIG. 2.

In response to the active signal ACT, the sense amplifier driving signal generation circuit 310 enables the first sense amplifier driving voltage application signal SAP1 to a logic high level for the preselected time, and enables the third pre-sense amplifier driving voltage application signal SAN_pre to a logic high level. The sense amplifier driving signal generation circuit 310 enables the second pre-sense amplifier driving voltage application signal SAP2_pre to a logic high level when the first sense amplifier driving voltage application signal SAP1 is disabled to a logic low level. The sense amplifier driving signal generation circuit 310 disables the second and third pre-sense amplifier driving voltage application signals SAP2_pre and SAN_pre to logic low levels in response to the precharge signal PCG.

The write pulse generation circuit 200 of FIG. 1 generates the write pulses WR_p which are enabled three times to a logic high level, in response to the three write signals WR, as shown in the timing diagram of FIG. 4.

The precharge pulse generation circuit 320 of FIG. 2 generates the precharge pulse P_p in response to the precharge signal PCG, as shown in the timing diagram of FIG. 4. The precharge pulse generation circuit 320 generates the precharge pulse P_p which is enabled at a timing earlier by a time A than a timing at which the second and third pre-sense amplifier driving voltage application signals SAP2_pre and SAN_pre are disabled. The precharge pulse generation circuit 320 generates the precharge pulse P_p which is enabled for a predefined time at a timing earlier by the time A than a timing at which the second and third pre-sense amplifier driving voltage application signals SAP2_pre and SAN_pre are disabled. Thus, it ensures that the write pulse WR_p, which is generated last among the successively generated write pulses WR_p, exists during the enable period of the precharge pulse P_p.

The last write pulse detection circuit 330 of FIG. 2, as a circuit which detects whether there is a write pulse WR_p which is generated during the enable period of the precharge pulse P_p, outputs the write pulse WR_p which is generated during the enable period of the precharge pulse P_p, as the detection pulse WR_lp, as shown in FIG. 4. As a result, if the write pulse WR_p exists during the enable period iG of the precharge pulse P_p, the detection pulse WR_lp is generated. The fact that the detection pulse WR_lp is generated means that the write pulse WR_p is generated by the write command which is inputted last, among the sequentially generated write pulses WR_p.

The floating pulse generation circuit 340 of FIG. 2 generates the floating pulse F_p when the detection pulse WR_lp is inputted, as shown in the timing diagram of FIG. 4.

The floating control circuit 350 of FIG. 2 outputs the second and third sense amplifier driving voltage application signals SAP2 and SAN by disabling the second and third pre-sense amplifier driving voltage application signals SAP2_pre and SAN_pre during the enable period of the floating pulse F_p.

As a result, the second and third sense amplifier driving voltage application signals SAP2 and SAN have the same enable timings as the second and third pre-sense amplifier driving voltage application signals SAP2_pre and SAN_pre. The second and third sense amplifier driving voltage application signals SAP2 and SAN are disabled during the period in which the floating pulse F_p is enabled, and are then enabled when the floating pulse F_p is disabled. Thereafter, when the second and third pre-sense amplifier driving voltage application signals SAP2_pre and SAN_pre are disabled, the second and third sense amplifier driving voltage application signals SAP2 and SAN are also disabled.

The first to third sense amplifier driving voltage application signals SAP1, SAP2, and SAN are generated as shown in the timing diagram of FIG. 4. In response to the first to third sense amplifier driving voltage application signals SAP1, SAP2, and SAN, the sense amplifier driving voltage providing circuit 400 of FIG. 1 operates as follows.

During the enable period of the first sense amplifier driving voltage application signal SAP1, the sense amplifier driving voltage providing circuit 400 provides the external voltage VDD to the first driving voltage application line RTO.

During the enable period of the second sense amplifier driving voltage application signal SAP2, the sense amplifier driving voltage providing circuit 400 provides the core voltage Vcore to the first driving voltage application line RTO.

During the enable period of the third sense amplifier driving voltage application signal SAN, the sense amplifier driving voltage providing circuit 400 applies the ground voltage VSS to the second driving voltage application line SB.

The sense amplifier 500 of FIG. 1 is activated when it is applied with the driving voltages VDD, Vcore, and VSS through the first and second driving voltage application lines RTO and SB. The activated sense amplifier 500 senses and amplifies the voltage difference of the bit line BL and the bit line bar BLb, and holds the voltage levels of the bit line BL and the bit line bar BLb which are amplified while the sense amplifier 500 is activated. During the period in which the second and third sense amplifier driving voltage application signals SAP2 and SAN are disabled, the providing of the driving voltages VDD, Vcore, and VSS through the first and second driving voltage application lines RTO and SB is blocked. If the providing of the driving voltages VDD, Vcore, and VSS through the first and second driving voltage application lines RTO and SB is blocked, the sense amplifier 500 is deactivated, and the bit line BL and the bit line bar BLb become a floating state.

After a bank is activated as an active command is inputted, when data are stored in the activated bank as write commands are successively inputted, the semiconductor memory device in accordance with the embodiment deactivates a sense amplifier for a preset time, by the write command inputted last, thereby floating a bit line and a bit line bar. Since the bit line and the bit line bar, which are floating, are apt to be changed in their voltage levels by inputted data, a write operation time may be decreased, which is advantageous to a high speed operation. In a conventional semiconductor memory device, when a sense amplifier is activated while a write operation is performed, a bit line and a bit line bar have voltage levels which are sensed and amplified by a previous data value, and hold the amplified levels. When the bit line and the bit line bar hold the amplified levels, power consumed to invert the voltage levels of the bit line and the bit line bar by the data inputted by a write operation is large. In contrast, in the semiconductor memory device in accordance with the embodiment, the bit line and the bit line bar are floated in a last write operation while write operations are performed. Thus, when the last write operation is performed by the write command inputted last, power consumed to invert the voltage levels of the bit line and the bit line bar by data may be reduced since the bit line and the bit line bar are floated.

While various embodiments have been described above, it will be understood to those skilled in the art that the embodiments described are examples only. Accordingly, the semiconductor memory device described herein should not be limited based on the described embodiments.

What is claimed is:

1. A semiconductor memory device comprising:
   a sense amplifier control circuit configured to generate a first sense amplifier driving voltage application signal, a second sense amplifier driving voltage application signal, and a third sense amplifier driving voltage application signal in response to an active signal, a precharge signal, and write pulses, including a last write pulse; and
   a sense amplifier driving voltage providing circuit configured to provide driving voltages to a sense amplifier during enable periods of the first to third sense amplifier driving voltage application signals,
   wherein the sense amplifier is disabled in response to detection of the last write pulse.

2. The semiconductor memory device according to claim 1, wherein the sense amplifier control circuit enables the first and third sense amplifier driving voltage application signals in response to the active signal, and disables the second and third sense amplifier driving voltage application signals in response to the write pulse and the precharge signal.

3. The semiconductor memory device according to claim 2, wherein the sense amplifier control circuit comprises:
   a sense amplifier driving signal generation circuit configured to generate the first sense amplifier driving voltage application signal, a second pre-sense amplifier driving voltage application signal, and a third pre-sense amplifier driving voltage application signal in response to the active signal and the precharge signal;
   a precharge pulse generation circuit configured to generate a precharge pulse in response to the precharge signal;
   a last write pulse detection circuit configured to generate a detection pulse, indicating detection of the last write pulse, in response to the write pulse and the precharge pulse;
   a floating pulse generation circuit configured to generate a floating pulse in response to the detection pulse; and
   a floating control circuit configured to generate the second and third sense amplifier driving voltage application signals in response to the second and third pre-sense amplifier driving voltage application signals and the floating pulse.

4. The semiconductor memory device according to claim 3, wherein the sense amplifier driving signal generation circuit enables the first sense amplifier driving voltage application signal and enables the third pre-sense amplifier driving voltage application signal in response to the active signal, enables the second pre-sense amplifier driving voltage application signal when the first sense amplifier driving voltage application signal is disabled, and disables the second and third pre-sense amplifier driving voltage application signals in response to the precharge signal.

5. The semiconductor memory device according to claim 3, wherein the last write pulse detection circuit outputs the write pulse as the detection pulse when the write pulse is inputted during an enable period of the precharge pulse.

6. The semiconductor memory device according to claim 3,
   wherein the floating control circuit outputs the second and third pre-sense amplifier driving voltage application signals as the second and third sense amplifier driving voltage application signals during a disable period of the floating pulse, and
   wherein the floating control circuit disables the second and third sense amplifier driving voltage application signals when the second and third pre-sense amplifier driving voltage application signals are enabled, during an enable period of the floating pulse.

7. The semiconductor device according to claim 1, wherein the sense amplifier driving voltage providing circuit comprises:
   a first voltage switch circuit configured to provide an external voltage to a first driving voltage application line in response to the first sense amplifier driving voltage application signal;
   a second voltage switch circuit configured to provide a core voltage to the first driving voltage application line in response to the second sense amplifier driving voltage application signal; and
   a third voltage switch circuit configured to provide a ground voltage to a second driving voltage application line in response to the third sense amplifier driving voltage application signal.

8. The semiconductor device according to claim 7, wherein the first voltage switch circuit includes a first transistor that has a gate which receives the first sense amplifier driving voltage application signal, a drain that is applied with the external voltage, and a source coupled to the first driving voltage application line.

9. The semiconductor device according to claim 7, wherein the second voltage switch circuit includes a second transistor that has a gate which receives the second sense amplifier driving voltage application signal, a drain which is applied with the core voltage, and a source coupled to the first driving voltage application line.

10. The semiconductor device according to claim 7, wherein the third voltage switch circuit includes a third transistor that includes a gate which receives the third sense amplifier driving voltage application signal, a drain coupled to the second driving voltage application line, and a source which is applied with the ground voltage.

11. A semiconductor memory device comprising:
    a sense amplifier control circuit configured to enable a sense amplifier driving voltage application signal in response to an active signal, and disable the sense amplifier driving voltage application signal in response to a precharge signal and a last write pulse; and
    a sense amplifier driving voltage providing circuit configured to provide a voltage to a sense amplifier during an enable period of the sense amplifier driving voltage application signal.

12. The semiconductor memory device according to claim 11, wherein the sense amplifier control circuit enables the sense amplifier driving voltage application signal a plurality of times in response to the active signal, the precharge signal, and the write pulse.

13. The semiconductor memory device according to claim 12, wherein the sense amplifier control circuit enables the sense amplifier driving voltage application signal in response to the active signal, disables the sense amplifier driving voltage application signal which is enabled, for a preset time, in response to the write pulse, and disables the sense amplifier driving voltage application signal which is enabled again, in response to the precharge signal.

14. A semiconductor memory device comprising:
    a sense amplifier; and
    a driving voltage generation circuit configured to generate a driving voltage for driving the sense amplifier, which disables the sense amplifier in response to a last write signal among a series of write signals, wherein the last write signal is generated during a period in which a precharge signal is enabled.

\* \* \* \* \*